United States Patent [19]

Shimizu et al.

[11] 4,383,319
[45] May 10, 1983

[54] SEMICONDUCTOR LASER

[75] Inventors: Hirokazu Shimizu, Toyonaka; Masaru Wada; Takashi Sugino, both of Takatsuki; Kunio Itoh, Uji, all of Japan

[73] Assignee: Matsushita Electric Industrial Co., Ltd., Kadoma, Japan

[21] Appl. No.: 183,413

[22] Filed: Sep. 2, 1980

[30] Foreign Application Priority Data

Sep. 4, 1979 [JP] Japan .................................. 54-113738

[51] Int. Cl.³ .............................................. H01S 3/19
[52] U.S. Cl. ........................................ 372/45; 357/17; 357/61
[58] Field of Search ............... 331/94.5 H; 357/16–18, 357/61; 372/45, 46

[56] References Cited

PUBLICATIONS

Salathe et al., "Laser Diodes with Stripe Geometry Contacts Produced by Laser Alloying", 1979 IEEE/OSA Conference on Laser Engineering and Applications, Jun. 1979, pp. 47–48.

Salathe et al., "Laser-Alloyed Stripe-Geometry DH Lasers", App. Phys. Lett. 35 (6), 15 Sep. 1979, pp. 439–440.

Shima et al., "Improvement of Photoluminescence Property of (GaAl)As double–Heterostructure Laser with Buffer Layer", App. Phys. Lett., vol. 36, No. 6, Mar. 1980 pp. 395–397.

Primary Examiner—James W. Davie
Attorney, Agent, or Firm—Cushman, Darby & Cushman

[57] ABSTRACT

In a laser comprising a GaAs substrate, an active layer of GaAlAs put between a first and a second clad layers, a buffer layer is disposed between said first clad layer and said substrate, and thermal expansion coefficient of the buffer layer is selected smaller than that of said active layer; thereby an internal stress of the active layer is released and lifetime of the laser is very much prolonged.

2 Claims, 9 Drawing Figures

SEMICONDUCTOR LASER

BACKGROUND OF THE INVENTION

1. Field of the Invention

The present invention relates to an improvement in a semiconductor laser, especially for lasing in a comparatively short wavelength, for example, capable of lasing in short wavelength, for example, 720 nm, at room temperature for a long liftetime.

2. Prior Art

Semiconductor lasers, for example, III–V compound semiconductor lasers utilizing GaAs-GaAlAs heterostructure formed by liquid phase epitaxial growth have such advantages as they can operate with a high efficiency even with a small sized device, and can be modulated directly by its driving current. Therefore the semiconductor lasers can be expected to have a large prosperous market as sources for various technology of handling light information. In order to utilize the laser for such purpose, it is required to realize a long lifetime. Recently, developments of semiconductor lasers for lasing at the wave lengths shorter than 800 nm are carried on mainly in the GaAlAs lasers. The problem in such laser for lasing in a short wavelength is the shortness of life time due to high contents of Al required for the short wavelength lasing.

FIG. 1 is a sectional view by a sectional plane perpendicular to a direction of laser output light of one example of a conventional visible light semiconductor laser. In the laser of FIG. 1, an active region of $Ga_{1-x}Al_xAs$ ($0<x<1$) is disposed between a lower clad layer 2 and an upper clad layer 4, both of $Ga_{1-y}Al_yAs$ ($0<y<1$). In order to obtain a short wavelength of lasing, the value x must be increased, and on the other hand, the value y is selected in a manner to give such a sufficient band gap between the active region 3 and the clad layer 2 or 4 as to confine carriers in the active layer. For example, in order to obtain lasing wavelength of 750 nm, these values are selected that $x \simeq 0.18$ and $y \simeq 0.61$, and appropriate thickness of the clad layers 2 and 4 are 1 to 3 $\mu$m. By suitably selecting the values x and y, a continuous wave lasing at room temperature becomes possible. However, on the other hand, the increases of the values x (i.e., increase of aluminum content in the active region) induces an increase of stress in the active region, which stress causes a shortened lifetime of the laser.

The stress in the active region is elucidated more in detail. The GaAs which forms substrate 1 has a larger thermal expansion coefficient than GaAlAs which forms the clad layers 2 and 4, and the active region 3 has a thermal expansion coefficient intermediate of the abovementioned two members 1 and 2. The semiconductor laser is in general made by the liquid phase epitaxial growth process, where the growth is made at such a high temperature as about 800° C., and the layers of the laser have different thermal expansion coefficients. Therefore, a considerable internal stress is produced by cooling it down from the high temperature of about 800° C. to a room temperature, thereby the stress is induced in the active region 3.

The larger the difference of the thermal expansion coefficients of the substrate 1 and the active region 3 is, the larger the internal stress of the active region 3 becomes. And the larger the value x (AlAs mole fraction in the active region) is, the larger the difference of the thermal expansion coefficient becomes. And the problem is that in order to obtain lasing with a shorter wavelength in the visible ray range, the wavelength becomes shorter and a larger value of x of the mixed crystal $Ga_{1-x}Al_xAs$ is required. This means that, in the conventional laser of the construction of FIG. 1, the stress in the active region becomes larger when the wavelength of lasing becomes shorter, and this fact has been confirmed both by experiments and calculation. The stress in the active region of the laser of FIG. 1 with respect to the value x varies as shown by a graph of FIG. 2. The details of the conventional laser, characteristic of which is shown in FIG. 1, is as follows:

substrate 1 of n-GaAs . . . 100 $\mu$m thick;
first clad layer 2 of n-$Ga_{1-y}Al_yAs$ ($0<y<1$) . . . 2.5 $\mu$m thick,
active region 3 of n-$Ga_{1-x}Al_xAs$ ($0<x<1$) . . . 0.1 $\mu$m thick,
second clad layer 4 of p-$Ga_{1-y}Al_yAs$ ($0<y<1$) . . . 1.0 $\mu$m thick,
electrode contacting layer 5 of p-GaAs . . . 1.0 $\mu$m thick,
hetero-isolation layer 6 of $n^+$-GaAlAs . . . 1.0 $\mu$m thick,
metal electrodes 7 and 8 are . . . on top and bottom faces.

Accordingly, elimination of the stress in the active region 3 due to the difference of the thermal expansion coefficient of the substrate 1 and the active region 3 of the laser is a very important problem in order to improve the lifetime of the semiconductor laser.

SUMMARY OF THE INVENTION

The present invention provides a semiconductor laser capable of lasing at a short wavelength at a room temperature for a drastically improved long lifetime.

More particularly, the semiconductor laser of the present invention can minimise undesirable stress in the active region thereby drastically prolonging the lifetime of the laser.

DESCRIPTION OF THE PREFERRED EMBODIMENT

The semiconductor laser in accordance with the present invention comprises a semiconductor substrate, a first semiconductor layer to work as an active region, a second semiconductor layer and a third semiconductor layer to serve as clad layers disposed contacting the lower face and the upper face of said first semiconductor layer, said first semiconductor layer having a thermal expansion coefficient equal to or smaller than that of said substrate, said second semiconductor layer and said third semiconductor layer having thermal expansion coefficient smaller than said first semiconductor layer, said first semiconductor layer, said second semiconductor layer and said third semiconductor layer being epitaxial layers disposed on said semiconductor substrate and, characterized in that the semiconductor laser further comprises a fourth layer disposed directly on the underneath face of said second layer or on the upper face of said third layer, said fourth layer having a thermal expansion coefficient smaller than that of said first semiconductor layer.

The second and fourth layers to serve as clad layers have, in comparison with the first layer to serve as the active layer, a larger forbidden band and smaller refractive index on top of the smaller thermal expansion coefficient. The fifth semiconductor layer serves as the buffer layer and decreases an internal stress of the active layer.

Figure 3:
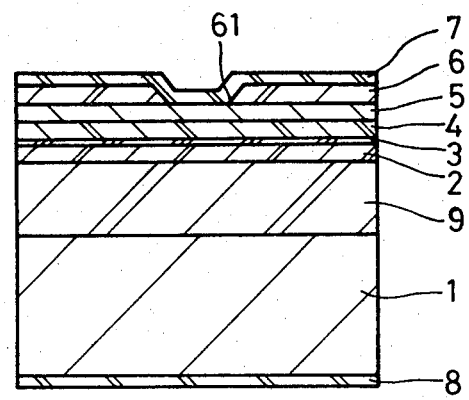
FIG. 3 is a sectional view by a sectional plane perpendicular to a direction of laser output light of a visible light semiconductor laser embodying the present invention.

A preferred example of the present invention is elucidated referring to FIG. 3 which is a sectional elevation view of a laser embodying the present invention taken by a sectional plane perpendicular to a direction of output lasing light. As shown in FIG. 3, the laser of the example has from the bottom to the top thereof substrate 1 of n-type GaAs . . . about 80 $\mu$m thick, a buffer layer 9, i.e., the fourth layer of n-type (Te-doped) $Ga_{1-u}Al_uAs$ $(0 < u < 1)$ . . . t=about 10 $\mu$m thick, a first clad layer 2, i.e., a second semiconductor layer (Te-doped) $Ga_{1-y}Al_yAs$ $(0 < y < 1)$ . . . about 1 $\mu$m thick, an active layer 3, i.e., a first layer 3 of undoped $Ga_{1-x}Al_xAs$ $(0 < x < 1)$ . . . about 0.1 $\mu$m thick, a second clad layer 4, i.e., a third semiconductor layer of p-type (Zn-doped) $Ga_{1-y}Al_yAs$ $(0 < y < 1)$ . . . about 1 $\mu$m thick, a cap layer 5, i.e., a fifth layer of p$^+$-type (Ge-doped) GaAs for ohmic contacting to a positive electrode . . . about 1 $\mu$m thick, and a hetero-isolation layer 6 for current path limiting, with a stripe-shaped opening for the ohmic contacting, of n-type (Sn-doped) $Ga_{0.5}Al_{0.5}As$ . . . about 1 $\mu$m thick.

The AlAs mole fractions y of the first and second clad layers 2 and 4 can be different by a little, for example 20%.

These layers are formed by known liquid phase epitaxial growths process. That is, the buffer layer 9, the first clad layer 2, the active region 3, the second clad layer 4, the cap layer 5 and the hetero-isolation layer 6 are sequentially grown in this order by the liquid phase epitaxial growth method on the substrate 1 by using a known slide boat method, and the opening 61 of about 10 $\mu$m width is formed by known selective chemical etching in the isolation layer 6. Temperature of growth starting is selected at 830° C. A positive side electrode 7 is formed by known sequential vacuum depositions of Ti, Pt and Au, so that the positive side electrode 7 makes an ohmic contact to the cap layer 5 at the stripe-shaped exposed region thereof exposed from the opening 61. The bottom side face of the substrate 1 is chemically etched in a manner that the total thickness of the wafer becomes about 100 $\mu$m. Then, a negative side electrode 8 of known Au-Ge-Ni alloy is provided by a vacuum deposition.

Figure 9:
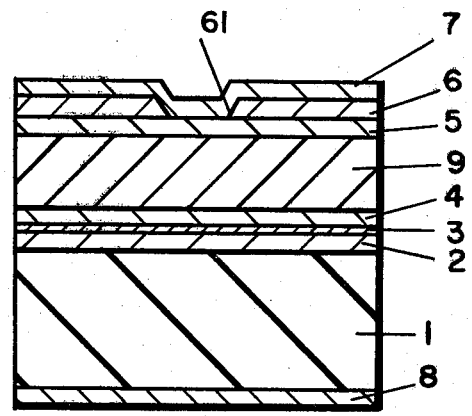
FIG. 9 is a sectional view similar to FIG. 3 but showing the buffer layer on top of the clad layer 4.

FIG. 9 is a sectional view similar to FIG. 3 but showing the buffer layer formed on top of the clad layer 4.

Figure 4:
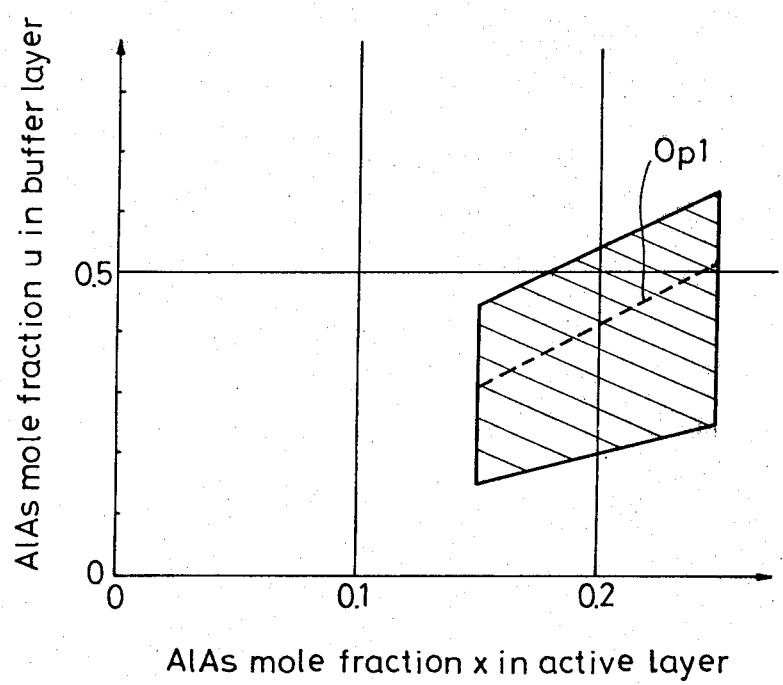
FIG. 4 is a graph showing a relation between a value x of a mixed crystal $Ga_{1-x}Al_xAs$ which constitutes an active region 3 and a value u of a mixed crystal $Ga_{1-u}Al_uAs$ which constitutes a buffer layer 9, for providing a useful effect in accordance with the present invention.

The optimum value of u, which is a mole fraction of AlAs crystal to the GaAlAs mixed crystal of the buffer layer 9, is dependent on x value and y value, AlAs mole fractions, of the active region and the clad layers 2 and 4, respectively. The values of x and y are determined almost by the wavelength of the lasing, so as to give an energy gap necessary for carrier confinement and a refrax index gap necessary for light confinement. In FIG. 4, a hatched area shows a usable range of the values x and u for thickness t of the buffer layer 9 of 10 $\mu$m, with which values the internal stress of the active region 3 can be practically reduced so as to eliminate a damage of the active region, for the energy gap of 0.25-0.4 eV between the active region 3 and the clad layers 2 and 4. A broken line curve Op1 in the graph of FIG. 4 shows optimum conditions wherein the stress of the active region 3 becomes smallest.

Figure 5:
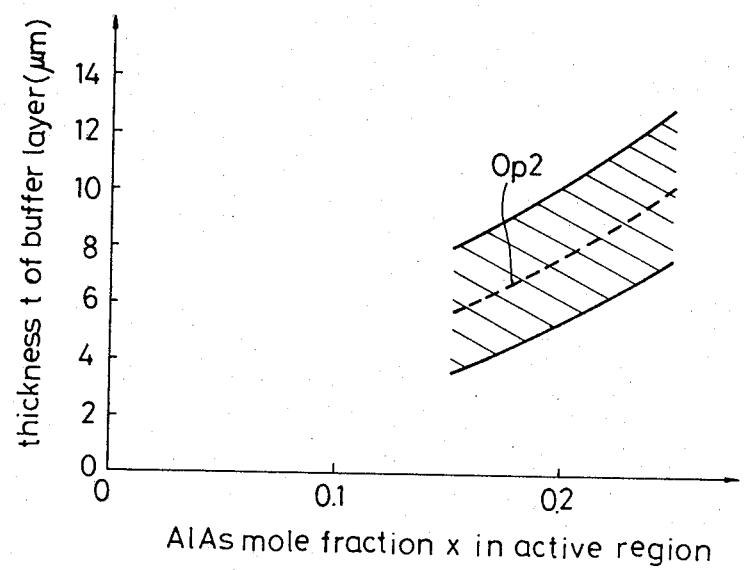
FIG. 5 is a graph showing the value x and thickness of buffer layer, for providing a useful effect in accordance with the present invention.

FIG. 5 shows a relation between the AlAs mole fraction x and the thickness t of the buffer layer 9. In FIG. 5, the hatched area shows a usable area in which the internal stress of the active region 3 can be practically reduced so as to eliminate a damage of the active region, for combinations of the value x of the active region 3 and thickness t of the buffer layer 9, wherein the value u is selected 0.5. A broken line Op2 in the graph of FIG. 5 shows optimum conditions wherein the stress of the active region 3 becomes smallest.

Figure 1:
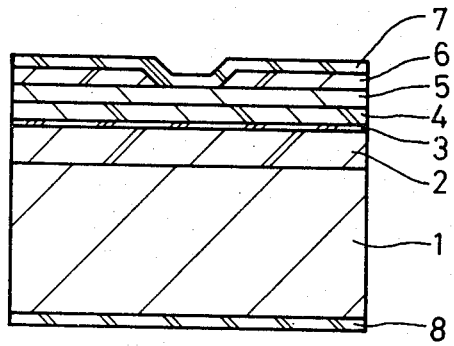
FIG. 1 is the sectional view by a sectional plane perpendicular to a direction of laser output light of one example of a conventional visible light semiconductor laser.
Figure 2:
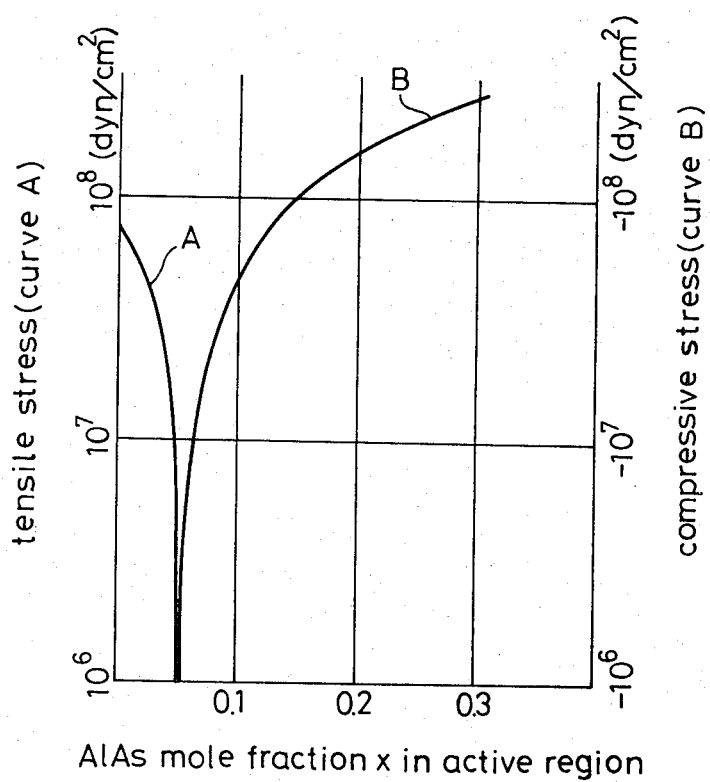
FIG. 2 is a graph showing a relations between internal stress of an active region of the laser of FIG. 1 and a value x of a mixed crystal $Ga_{1-x}Al_xAs$ which constitutes the active region 3.
Figure 6:
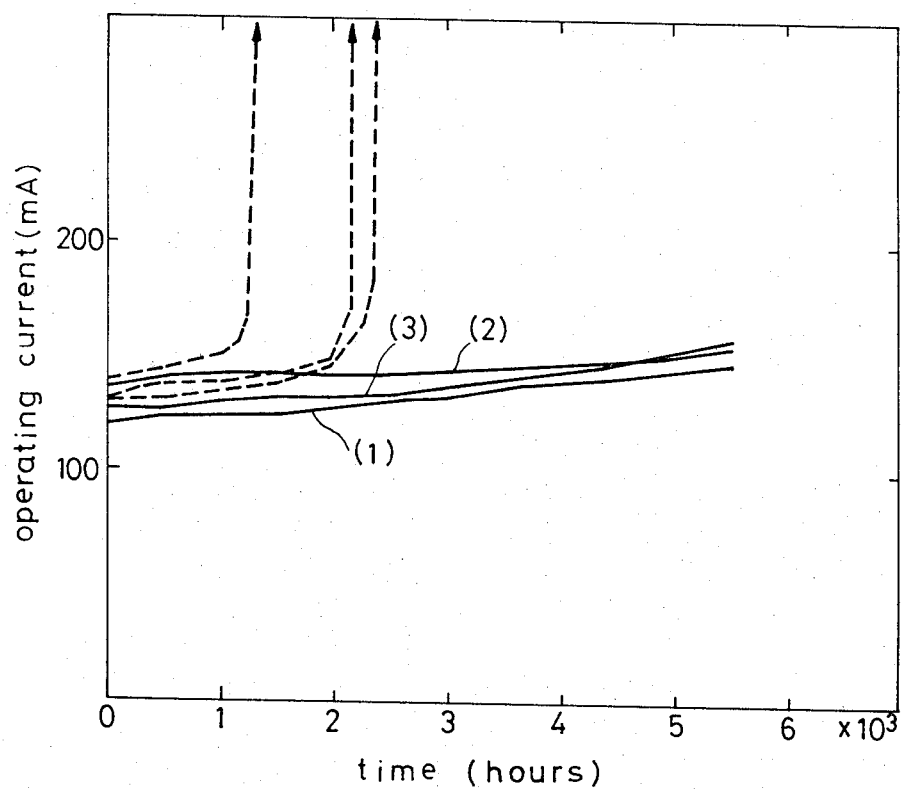
FIG. 6 is a graph showing lifetime characteristics of the conventional laser of FIG. 1 and the laser of FIG. 3, embodying the present invention.

FIG. 6 is a graph showing curves of lifetime characteristics of the semiconductor lasers operated to lase 755 nm wavelength at 50° C. Therein, solid line curves show the lifetime characteristics of the semiconductor laser in accordance with the present invention and broken line curves show those of the conventional semiconductor lasers of FIG. 1. The curves (1), (2) and (3) of FIG. 6 are for the examples embodying the present invention, wherein the AlAs mole fractions x, y and u, as well as the buffer layer thickness t are selected as follows:

| example | x | y | u | t |
| --- | --- | --- | --- | --- |
| (1) | 0.16 | 0.48 | 0.40 | 6 |
| (2) | 0.20 | 0.61 | 0.50 | 8 |

-continued

| example | x | y | u | t |
|---|---|---|---|---|
| (3) | 0.23 | 0.74 | 0.50 | 10 |

Figure 7:
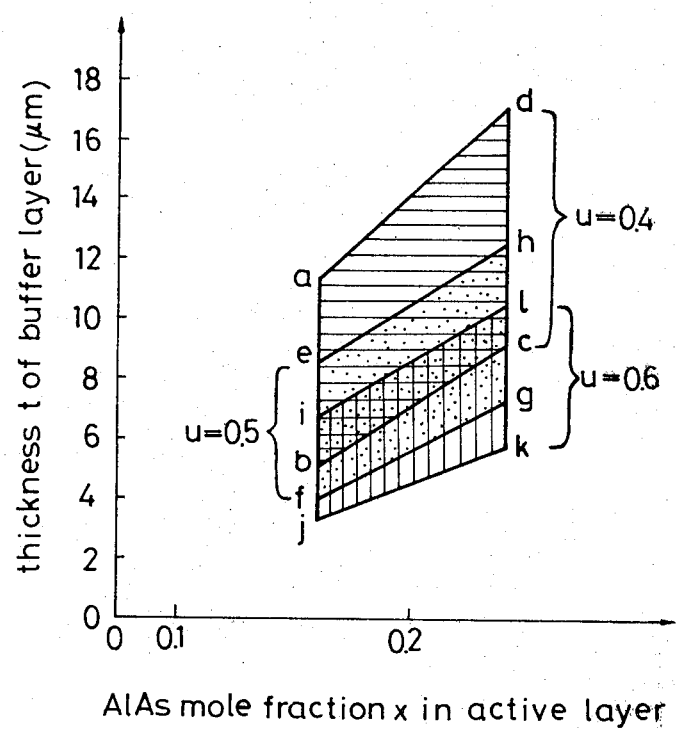
FIG. 7 is a graph showing the relationship between the AlAs mole fraction and thickness of the buffer layer.
Figure 8:
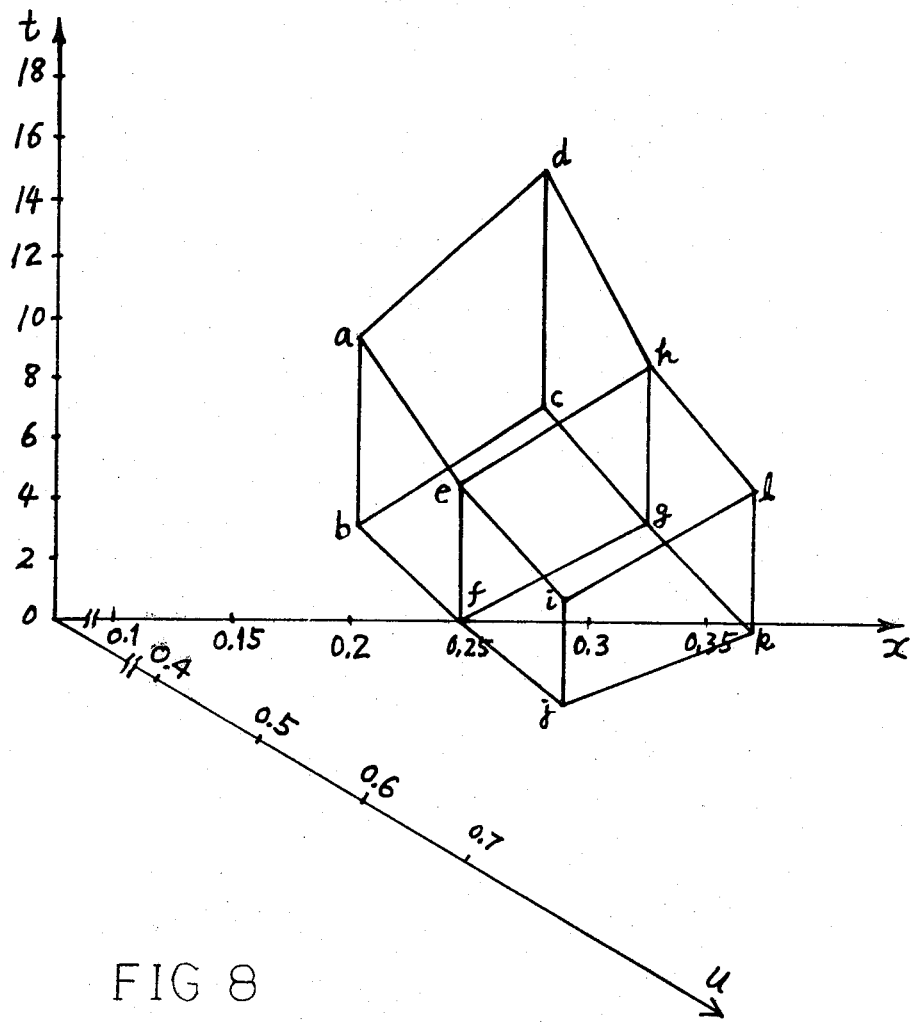
FIG. 8 is a three dimensional graph showing the region for obtaining good lifetime characteristics.

FIG. 7 shows a graph of relations between the AlAs mole fraction x and the thickness t of the buffer layer 9. The graph shows a practically more usable range in x-u-t three dimensional range in which the internal stress of the active region 3 can be practically reduced so as to eliminate a damage of the active region, for three different values of u as parameters. The upper area encircled by the points a, b, c and d hatched with horizontal lines is for the condition of u=0.4. The central area encircled by the points e, f, g and h filled with dots is for the condition of u=0.5. The lower area encircled by the points i, j, k and l hatched with vertical lines is for the condition of u=0.6. FIG. 8 is a perspective three-dimensional graph of rectangular coordinate graduated by the variations x, t and u.

Through many experiments, it is found that, in the x-u-t three-dimensional coordinate, a three dimensional region shown in FIG. 8 defined as follows is practically more advantageous in order to obtain good lifetime characteristics:

The three dimensional region is defined by
two parallel planes x=0.16 and x=0.24
two parallel planes u=0.4 and u=0.6
and
a first upper face encircled by the following points:
a (x=0.16, t=11.4, u=0.4)
e (x=0.16, t=8.6, u=0.5)
h (x=0.24, t=12.6, u=0.5)
d (x=0.24, t=17, u=0.4)
and
a second upper face encircled by the following points:
e (x=0.16, t=8.6, u=0.5)
i (x=0.16, t=6.8, u=0.6)
l (x=0.24, t=10.6, u=0.6)
h (x=0.24, t=12.6, u=0.5)
and
a first lower face encircled by the following points:
b (x=0.16, t=5.0, u=0.4)
f (x=0.16, t=4.0, u=0.5)
g (x=0.24, t=7.3, u=0.5)
c (x=0.24, t=9.0, u=0.4)
and
a second lower face encircled by the following points:
f (x=0.16, t=4.0, u=0.5)
j (x=0.16, t=3.3, u=0.6)
k (x=0.24, t=5.8, u=0.6)
g (x=0.24, t=7.3, u=0.5).

The laser in accordance with the present invention can lase at a wavelength of 780 nm or shorter at room temperature for very long lifetime of more than 10 thousand hours.

What is claimed is:

1. In a semiconductor laser the improvement comprising:
a semiconductor substrate,
a first semiconductor layer to work as an active region,
a second semiconductor layer and a third semiconductor layer to serve as clad layers disposed contacting the lower face and the upper face of said first semiconductor layer,
said first semiconductor layer having a thermal expansion coefficient equal to or smaller than that of said substrate,
said first semiconductor layer having a thermal expansion coefficient equal to or smaller than that of said substrate, said second semiconductor layer and said third semiconductor layer having thermal expansion coefficients smaller than said first semiconductor layer,
said first semiconductor layer, said second semiconductor layer and said third semiconductor layer being epitaxial layers disposed on said semiconductor substrate and,
characterized in that
the semiconductor laser further comprises a fourth layer as a buffer layer on one of the underneath face of said second layer and the upper face of said third layer, said fourth layer having a thermal expansion coefficient smaller than that of said first semiconductor layer, and wherein said active layer is formed of a mixed crystal $Ga_{1-x}Al_xAs$ and said buffer layer is formed of a mixed crystal $Ga_{1-u}Al_uAs$ and t represents the buffer layer thickness and wherein the values x, u and t are selected in a range contained in a x-u-t three dimensional region defined by:
two parallel planes x=0.16 and x=0.24
two parallel planes u=0.4 and u=0.6 and a first upper face encircled by the following points:
a (x=0.16, t=11.4, u=0.4)
e (x=0.16, t=8.6, u=0.5)
h (x=0.24, t=12.6, u=0.5)
d (x=0.24, t=17, u=0.4)
and a second upper face encircled by the following points:
e (x=0.16, t=8.6, u=0.5)
i (x=0.16, t=6.8, u=0.6)
l (x=0.24, t=10.6, u=0.6)
h (x=0.24, t=12.6, u=0.5)
and a first lower face encircled by the following points:
b (x=0.16, t=5.0, u=0.4)
f (x=0.16, t=4.0, u=0.5)
g (x=0.24, t=7.3, u=0.5)
c (x=0.24, t=9.0, u=0.4)
and a second lower face encircled by the following points:
f (x=0.16, t=4.0, u=0.5)
j (x=0.16, t=3.3, u=0.6)
k (x=0.24, t=5.8, u=0.6)
g (x=0.24, t=7.3, u=0.5).

2. In a semiconductor laser the improvement comprising:
a semiconductor substrate;
a first semiconductor layer to work as an active region and formed from a mixed crystal $Ga_{1-x}Al_xAs$ where the Al mole fraction x is larger than 0.15;
a second semiconductor layer and a third semiconductor layer to serve as clad layers disposed contacting the lower face and the upper face of said first semiconductor layer;
said first semiconductor layer having a thermal expansion coefficient equal to or smaller than that of said substrate;
said second semiconductor layer and said third semiconductor layer having thermal expansion coefficients smaller than said first semiconductor layer;
said first semiconductor layer, said second semiconductor layer and said third semiconductor layer being epitaxial layers disposed on said semiconductor substrate;
and wherein the semiconductor laser further comprises a fourth layer as a buffer layer on one of the underneath face of said second layer and the upper face of said third layer, said fourth layer having a thermal expansion coefficient smaller than that of said first semiconductor layer.

* * * * *